United States Patent
Campbell et al.

(10) Patent No.: US 8,081,461 B2
(45) Date of Patent: Dec. 20, 2011

(54) COOLING APPARATUS WITH THERMALLY CONDUCTIVE POROUS MATERIAL AND JET IMPINGEMENT NOZZLE(S) EXTENDING THEREIN

(75) Inventors: Levi A. Campbell, Poughkeepsie, NY (US); Richard C. Chu, Poughkeepsie, NY (US); Michael J. Ellsworth, Jr., Poughkeepsie, NY (US); Madhusudan K. Iyengar, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 12/491,325

(22) Filed: Jun. 25, 2009

(65) Prior Publication Data
US 2010/0328888 A1    Dec. 30, 2010

(51) Int. Cl.
*H05K 7/20* (2006.01)
*F28F 7/00* (2006.01)
*H01L 23/34* (2006.01)

(52) U.S. Cl. ............ 361/700; 361/699; 361/679.53; 165/80.4; 165/80.5; 165/104.33; 257/714; 257/715; 174/15.1

(58) Field of Classification Search .......... 361/699–701, 361/679.53; 165/80.4–80.5, 104.33, 185; 257/714–716; 174/15.1
See application file for complete search history.

(56) References Cited

U.S. PATENT DOCUMENTS

| | | | | |
|---|---|---|---|---|
| 4,949,164 A | * | 8/1990 | Ohashi et al. | 257/715 |
| 5,150,274 A | * | 9/1992 | Okada et al. | 361/703 |
| 5,402,004 A | * | 3/1995 | Ozmat | 257/717 |
| 6,016,007 A | * | 1/2000 | Sanger et al. | 257/714 |
| 6,366,462 B1 | | 4/2002 | Chu et al. | |
| 6,411,508 B1 | * | 6/2002 | Kang et al. | 361/695 |
| 6,431,260 B1 | | 8/2002 | Chu et al. | |
| 6,519,151 B2 | | 2/2003 | Chu et al. | |
| 6,888,720 B2 | * | 5/2005 | Pfister et al. | 361/689 |
| 6,973,801 B1 | | 12/2005 | Campbell et al. | |
| 7,184,269 B2 | | 2/2007 | Campbell et al. | |

(Continued)

OTHER PUBLICATIONS

Campbell et al., "Cooling Apparatus and Method of Fabrication Thereof with Jet Impingement Structure Integrally Formed on Thermally Conductive Pin Fins", U.S. Appl. No. 12/141,290, filed Jun. 18, 2008.

(Continued)

*Primary Examiner* — Zachary M Pape
(74) *Attorney, Agent, or Firm* — Dennis Jung, Esq.; Kevin P. Radigan, Esq.; Heslin Rothenberg Farley & Mesiti P.C.

(57) ABSTRACT

A cooling apparatus and method of fabrication are provided for facilitating cooling of an electronic device. The cooling apparatus includes a thermally conductive porous material and a liquid coolant supply. The thermally conductive porous material (such as metal foam material) is coupled to a surface of the electronic device to be cooled, or a structure coupled to the electronic device. The liquid coolant supply includes a jet impingement structure, which includes one or more jet nozzles for directing liquid coolant onto the surface to be cooled. The jet nozzle(s) extends into the thermally conductive porous material, and facilitates delivery of liquid coolant onto the surface to be cooled. The thermally conductive porous material is in thermal contact with the surface to be cooled and facilitates cooling of the electronic device by boiling of the liquid coolant passing through the porous material.

20 Claims, 7 Drawing Sheets

U.S. PATENT DOCUMENTS

| | | | |
|---|---|---|---|
| 7,206,203 B2 | 4/2007 | Campbell et al. | |
| 7,233,494 B2 | 6/2007 | Campbell et al. | |
| 7,277,283 B2 | 10/2007 | Campbell et al. | |
| 7,301,770 B2 | 11/2007 | Campbell et al. | |
| 7,331,377 B1 * | 2/2008 | Toy | 165/80.4 |
| 7,362,574 B2 | 4/2008 | Campbell et al. | |
| 7,511,957 B2 | 3/2009 | Campbell et al. | |
| 7,742,297 B2 * | 6/2010 | Behrens et al. | 361/690 |
| 2003/0227750 A1 * | 12/2003 | Glovatsky et al. | 361/699 |
| 2004/0027806 A1 * | 2/2004 | Lin | 361/704 |
| 2005/0111188 A1 * | 5/2005 | Bhattacharya et al. | 361/699 |
| 2006/0157225 A1 * | 7/2006 | Martin et al. | 165/80.4 |
| 2007/0121299 A1 | 5/2007 | Campbell et al. | |
| 2007/0289729 A1 | 12/2007 | Campbell et al. | |
| 2007/0295480 A1 | 12/2007 | Campbell et al. | |
| 2008/0264604 A1 | 10/2008 | Campbell et al. | |

OTHER PUBLICATIONS

Campbell Et al., "Cooling Apparatus and Method of Fabrication Thereof with a Cold Plate Formed In Situ on a Surface to be Cooled", U.S. Appl. No. 12/143,289, filed Jun. 20, 2008.

* cited by examiner

COOLING APPARATUS WITH THERMALLY CONDUCTIVE POROUS MATERIAL AND JET IMPINGEMENT NOZZLE(S) EXTENDING THEREIN

BACKGROUND

The present invention relates to heat transfer mechanisms, and more particularly, to cooling apparatuses, cooled electronic devices and methods of fabrication thereof for removing heat generated by one or more electronic devices. Still more particularly, the present invention relates to cooling apparatuses and methods of cooling a thermally conductive surface comprising part of or coupled to the electronic device to be cooled.

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices therefore mandates the development of aggressive thermal management techniques, using liquid cooling. Various types of liquid coolants provide different cooling capabilities. For example, fluids such as refrigerants or other dielectric liquids (e.g., fluorocarbon liquid) exhibit lower thermal conductivity and specific heat properties compared to liquids such as water or other aqueous fluids. Dielectric liquids have an advantage, however, in that they may be placed in direct physical contact with electronic devices and their interconnects without adverse affects, such as corrosion or electrical short circuits. Other cooling liquids, such as water or other aqueous fluids, exhibit superior thermal conductivity and specific heat compared with dielectric fluids. Water-based coolants, however, must be kept from physical contact with electronic devices and interconnects, since corrosion and electrical short circuit problems are otherwise likely to result.

BRIEF SUMMARY

In one aspect, the shortcomings of the prior art are overcome and additional advantages are provided through the provision of a cooling apparatus. The cooling apparatus includes a housing, a thermally conductive porous material coupled to a surface to be cooled, and a liquid coolant supply. The housing includes a supply manifold and a return manifold, wherein the return manifold is in fluid communication with an outlet that extends through the supply manifold, and the thermally conductive porous material comprises at least one cavity exposing a portion of the surface to be cooled. The liquid coolant supply includes a jet impingement structure, which includes at least one jet nozzle for directing liquid coolant towards the surface to be cooled. The at least one jet nozzle extends into the at least one cavity in the thermally conductive porous material coupled to the surface to be cooled, and facilitates jet impingement of the liquid coolant onto the surface to be cooled.

In another aspect, a cooled electronic device is provided which includes one or more heat-generating electronic devices coupled to or comprising a surface to be cooled, and a cooling apparatus for cooling the surface to be cooled, and thereby the heat-generating electronic device(s). The cooling apparatus includes a housing, a thermally conductive porous material coupled to the surface to be cooled, and a liquid coolant supply comprising a jet impingement structure. The housing includes a supply manifold and a return manifold, wherein the return manifold is in fluid communication with an outlet that extends through the supply manifold, and the thermally conductive porous material comprises at least one cavity exposing a portion of the surface to be cooled. The jet impingement structure includes at least one jet nozzle for directing liquid coolant onto the surface to be cooled, wherein the at least one jet nozzle extends into the at least one cavity in the thermally conductive porous material coupled to the surface to be cooled, and facilitates jet impingement of the liquid coolant onto the surface to be cooled. During operative cooling of the surface to be cooled, the thermally conductive porous material coupled to the surface to be cooled facilitates boiling of liquid coolant passing therethrough, and thus; cooling of the heat-generating electronic device(s).

In a further aspect, a method is provided for fabricating a cooling apparatus for cooling a heat-generating electronic device coupled to or comprising a surface to be cooled. The method includes: providing a housing including a supply manifold and a return manifold, wherein the return manifold is in communication with an outlet that extends through the supply manifold; providing a thermally conductive porous material with at least one cavity extending therethrough; bonding the thermally conductive porous material to the surface to be cooled, wherein a portion of the surface to be cooled is exposed by the at least one cavity extending through the thermally conductive porous material; and disposing, in spaced relation to the surface to be cooled, at least one jet nozzle of a jet impingement structure at least partially within the at least one cavity so as to facilitate jet impingement of the liquid coolant onto the surface to be cooled, wherein the thermally conductive porous material coupled to the surface to be cooled facilitates boiling of liquid coolant passing therethrough.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
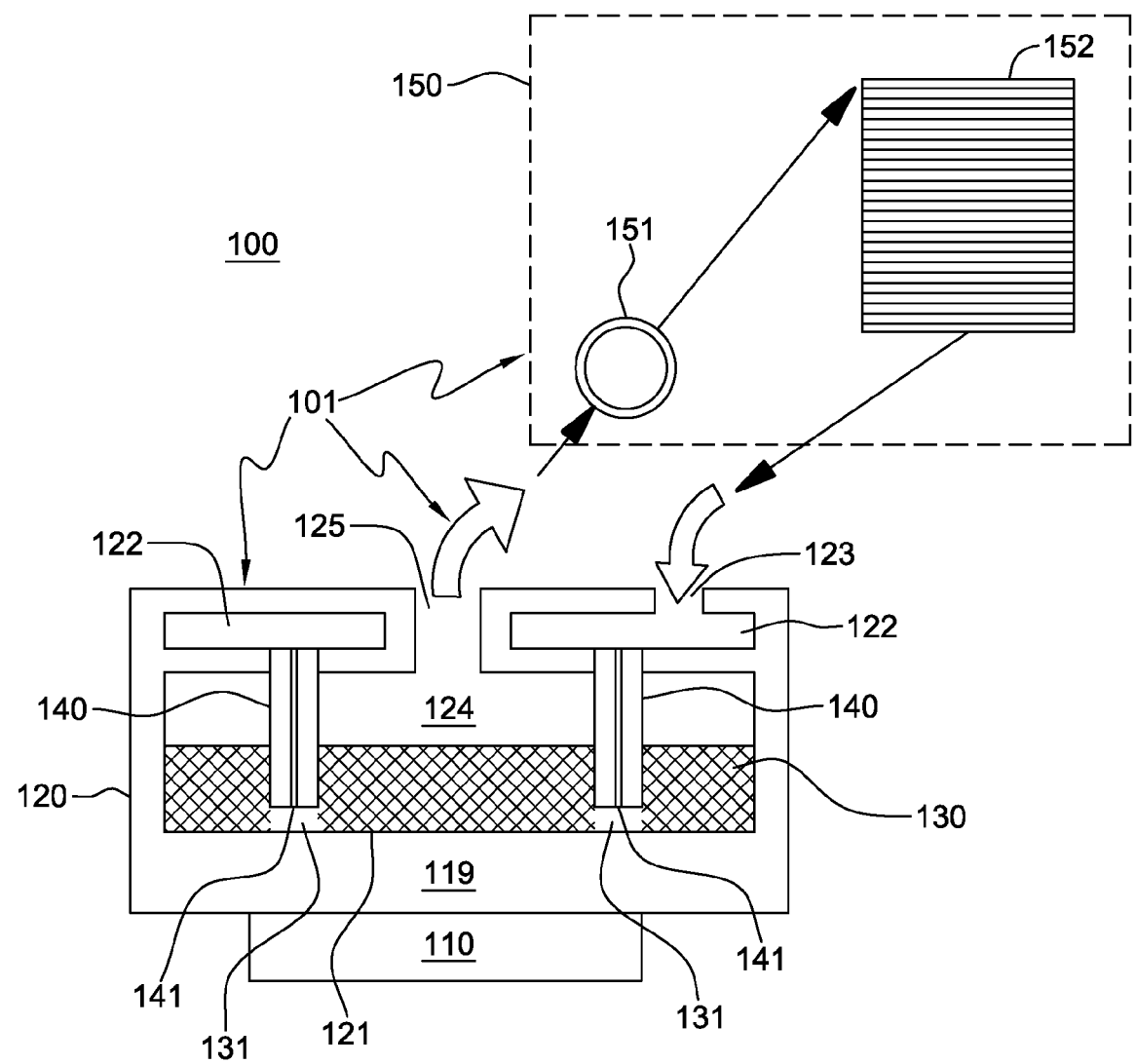
FIG. 1 depicts one embodiment of a cooled electronic device comprising a cooling apparatus which includes a vapor-compression heat exchange system, in accordance with an aspect of the present invention.

Generally stated, provided herein are cooling apparatuses, cooled electronic devices and methods of fabrication thereof which comprise a thermally conductive porous material bonded to a surface to be cooled and one or more jet nozzles extending into the thermally conductive porous material for directing liquid coolant onto the surface to be cooled. The surface to be cooled is a substantially planar main surface of a thermally conductive base, which comprises part of (or is coupled to) the electronic device to be cooled. The phrase "cooled electronic device" is used herein to include the heat-generating electronic device to be cooled with the cooling apparatus coupled thereto. In various embodiments, the cooling apparatus may include a vapor-compression heat exchange system or a pumped two-phase coolant system.

"Vapor-compression heat exchange system" means any heat exchange mechanism of the liquid coolant supply characterized as described herein through which refrigerant can circulate; and includes, an evaporator structure comprising the surface to be cooled and the thermally conductive porous material coupled thereto. As described further below, in one embodiment, liquid coolant impinges upon the surface to be cooled, turns 90 degrees and flows through the thermally conductive porous material. In the embodiments described herein, the vapor-compression heat exchange system further includes at least one expansion device (e.g., a capillary tube or controllable expansion valve) and a vapor-compression unit. The vapor-compression unit includes a compressor and a condenser disposed, for example, separate from the electronic device or module being cooled.

One example of a two-phase coolant for a cooling apparatus, such as described herein, is a two-phase dielectric coolant. For example, the two-phase dielectric coolant may comprise a fluorocarbon or segregated hydrofluoroether liquid (each of which is available from 3M Corporation, St. Paul, Minn., USA.) Fluorocarbon liquid typically boils at 30° C.-80° C., at atmospheric pressure. Those skilled in the art should note, however, that the concepts disclosed herein are readily adapted to other types of two-phase coolant. For example, in the vapor-compression heat exchange system implementation of the cooling apparatus, the two-phase coolant is a refrigerant, such as a hydrofluorocarbon refrigerant (e.g., HFC-R410a). In other implementations, the concepts disclosed herein may be adapted to use with other types of two-phase coolants, such as water, a brine, a liquid metal, or similar coolant, while still maintaining various advantages and unique features of the present invention.

One approach to controlling temperature of an electronic device is through coolant boiling. In one scenario, liquid coolant is pumped to an evaporator, which is thermally coupled to the electronic device. The coolant boils, absorbing heat dissipated by the electronic device, and the vaporized coolant is subsequently condensed back to a liquid by a condenser. In another approach, the coolant is a refrigerant which is pressurized as a vapor by a compressor, then condensed and expanded through an expansion valve (e.g., capillary tube) before entering the evaporator (coupled to the electronic device). One issue with these approaches is that the heat flux in the evaporator is limited by the onset of critical heat flux leading to a less-efficient film boiling at the evaporator. Solutions to this issue would include making the evaporator larger, using extended surfaces or multiple channels within the evaporator, or forcing flow boiling in small channels to increase the heat flux dissipated by the evaporator. However, each of these solutions would increase the size of the package required, which would limit overall package density.

Reference is made below to the drawings, which are not drawn to scale and are simplified for ease of understanding, wherein the same reference numbers used throughout different figures designate the same or similar components.

FIG. 1 depicts one embodiment of a cooled electronic device, generally denoted 100, in accordance with an aspect of the present invention. In this embodiment, cooled electronic device 100 includes an electronic device 110 to be cooled and a cooling apparatus 101 coupled thereto. As illustrated, cooling apparatus 101 is a vapor-compression heat exchange system and includes a housing 120 coupled to electronic device 110 to be cooled and a vapor-compression unit 150. Housing 120 includes a thermally conductive base 119, which in this example is physically and thermally coupled to electronic device 110 to be cooled. A planar main surface of thermally conductive base 119 within housing 120 comprises the surface to be cooled 121.

As illustrated in FIG. 1, housing 120 includes a coolant supply manifold 122 and a coolant return manifold 124 in fluid communication via a coolant inlet 123 and coolant outlet 125 (and appropriate tubes or hoses), respectively, with vapor-compression unit 150 of the vapor-compression heat exchange system. The coolant supply manifold 122 forms a portion of the liquid coolant supply, which also includes one or more jet nozzles 140 extending as shown towards the surface to be cooled 121. Each jet nozzle includes a respective jet orifice 141 for directing liquid coolant onto the surface to be cooled 121.

In the embodiment illustrated, a thermally conductive porous material 130 is coupled (e.g., thermally or metallurgically) to the surface to be cooled 121 and is of sufficient depth for the one or more jet nozzles to be spaced from the surface to be cooled and still extend into the thermally conductive porous material. A portion of a cavity 131 in the thermally conductive porous material remains between each jet orifice 141 and the surface to be cooled so as not to inhibit directing of liquid coolant onto the surface to be cooled. In this embodiment, the jet nozzles 140 are also configured with sufficient dimensions to function as expansion valves for the vapor-compression heat exchange system of the cooling apparatus illustrated.

By way of specific example, the thermally conductive porous structure may comprise a metal foam material soldered or brazed to the surface to be cooled, i.e., the evaporator surface to be cooled. This porous material provides a means to decrease the local heat flux and to prevent the onset of film boiling. The one or more jet nozzles may comprise integrated capillary tubes which decrease the overall package size and function to direct a jet of refrigerant (in this example) onto the surface to be cooled. After impacting the surface to be cooled, the refrigerant is turned along the surface to be cooled and into the porous structure, such that the refrigerant boils within the porous structure and travels up through the porous structure, with the entire porous structure potentially participating in heat transfer. In one example, hypodermic stock (or other small diameter tubing) may be employed as the combination jet nozzle and expansion valve. The jet nozzles may be fitted into holes bored into (or otherwise formed within) the thermally conductive porous material, with the thermally conductive porous material again being coupled via (for example) brazing or soldering, to the surface to be cooled. Refrigerant is forced through the jet nozzles to impinge on the surface to be cooled as a submerged jet. The submerged jet tends to spread radially outward from the stagnation point with a velocity profile tending to have a thin boundary layer and high convective heat transfer coefficient. This radially-spreading flow enters the porous material (e.g., metal foam), which conducts the heat dissipated by the surface to be cooled, thereby reducing the local heat flux. The refrigerant boils within the porous material and travels upward as vaporized coolant out of the porous material to the return manifold for output to the vapor-compression unit.

In operation, the vapor-compression heat exchange system of the cooled electronic device of FIG. 1 uses a circulating liquid refrigerant as the medium which absorbs and removes heat from the electronic device to be cooled, and subsequently rejects the heat via the vapor-compression unit. Specifically, the evaporator, i.e., the surface to be cooled and the thermally conductive porous material, removes heat from the electronic device (via the refrigerant) to the vapor-compression unit 150 where the heat is removed from the refrigerant via a compressor 151 and a condenser 152. Condenser 152 may be either liquid-cooled or air-cooled, depending upon the application. A cooling loop is provided between the evaporator, within housing 120 of the cooled electronic device, and the vapor-compression unit. This cooling loop includes a first refrigerant line connecting in fluid communication condenser 152 and coolant inlet 123 of the coolant supply manifold 122, and a second refrigerant line connecting in fluid communication coolant outlet 125 of coolant return manifold 124 and compressor 151 of vapor-compression unit 150. Because the vapor-compression heat exchange system is refrigerant-based (in one example), these refrigerant lines may advantageously be relatively long, allowing the vapor-compression unit to reside remote from the electronic device being cooled. In an air-cooled vapor-compression unit implementation, positioning of the vapor-compression unit outside the room housing the electronic device to be cooled may advantageously reduce acoustic noise within the room.

Circulating refrigerant enters compressor 151 in a thermodynamic state known as a saturated vapor, and is compressed to a higher pressure, resulting in a higher temperature as well. The hot, compressed vapor is then in the thermal dynamic state known as a super-heated vapor, and it is at a temperature and pressure at which it can be condensed with typically available cooling water or cooling air. The hot vapor is routed through condenser 152 where it is cooled and condensed into a liquid by flowing through a coil (or tubes) with cool water or cool air flowing across the coil (or tubes). This is where the circulating refrigerant rejects heat from the system and the rejected heat is carried away by either the water or air, depending upon the vapor-compression unit implementation.

The condensed liquid refrigerant, in the thermal dynamic state known as a saturated liquid, is next routed through one or more jet nozzles 140, which are configured and sized to function as expansion valves for the vapor-compression heat exchange system. Passing through the jet nozzles, the refrigerant undergoes an abrupt reduction in pressure. The pressure reduction results in the adiabatic flash evaporation of a portion of the liquid refrigerant. The auto-refrigeration effect of adiabatic flash evaporation further lowers the temperature of the liquid refrigerant. The cold liquid refrigerant is then directed towards the evaporator, that is, the surface to be cooled, which as noted above, has bonded thereto a thermally conductive porous material. Heat passing from the electronic device to be cooled evaporates the liquid refrigerant at the surface to be cooled and in the thermally conductive porous material. The circulating refrigerant thus absorbs and removes this heat, which is subsequently rejected in the condenser and transferred elsewhere by the water or air used to cool the condenser. The refrigeration cycle then repeats, with the refrigerant vapor from the evaporator (i.e., surface to be cooled and thermally conductive porous material) being routed back to the vapor-compression unit 150.

Figure 2:
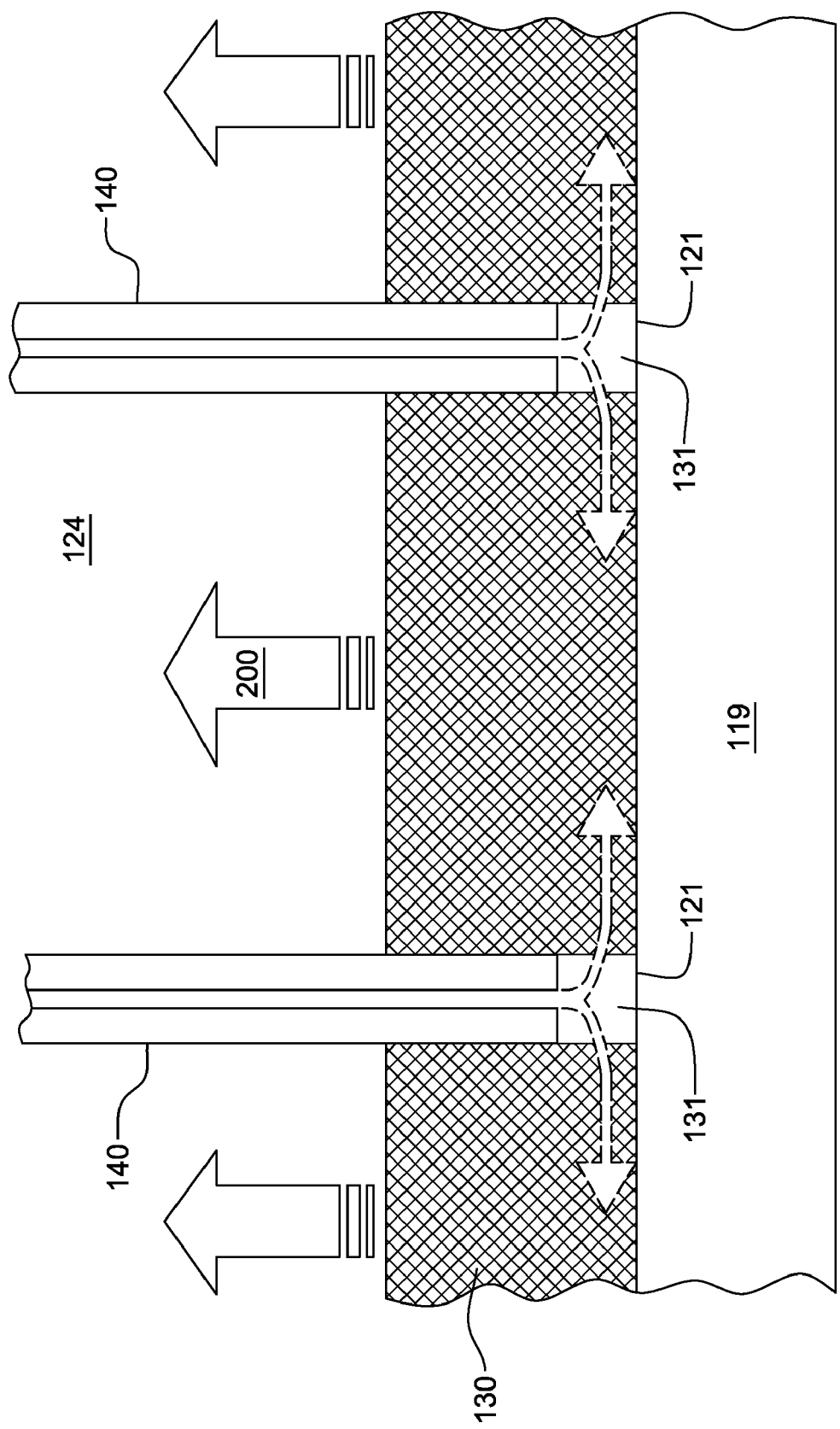
FIG. 2 is a partially enlarged, cross-sectional elevational depiction of the cooling apparatus of FIG. 1, in accordance with an aspect of the present invention.

FIG. 2 is a partially enlarged depiction of the cooling apparatus of FIG. 1, wherein thermally conductive base 119 of the housing is shown with thermally conductive porous material 130 coupled (e.g., bonded or otherwise physically contacting) to the surface to be cooled 121 of thermally conductive base 119. Appropriately sized cavities 131 are provided within the thermally conductive porous material 130 to accommodate the one or more jet nozzles 140 therein, as illustrated. Each jet nozzle remains spaced from the surface to be cooled such that a portion of the cavity 131 remains open between the jet nozzle and the surface to be cooled. Advantageously, provision of cavities 131 facilitates positioning of the nozzles within the thermally conductive porous material, and subsequently, impingement of liquid coolant from the respective jet nozzles onto the surface to be cooled. After impinging on the surface to be cooled, the liquid coolant is turned 90 degrees (as illustrated) to flow into thermally conductive porous material 130, where it undergoes boiling and passes to the coolant return manifold 124 as vaporized coolant 200. As a specific example, the thermally conductive porous material is a metal foam material, such as available from Chand Eisenmann Metallurgical, of Burlington, Conn., or Dunlap Equipment, of Coventry, West Midlands, England. The thickness of the thermally conductive porous material depends upon the amount of heat transfer required from the surface to be cooled. By way of example only, the thickness might be several millimeters to a couple of centimeters. In the embodiment of FIG. 2, the thermally conductive porous material is illustrated to have a uniform porosity orthogonal to the surface to be cooled, for example, in the porosity range of 30%-90% open.

Figure 3A:
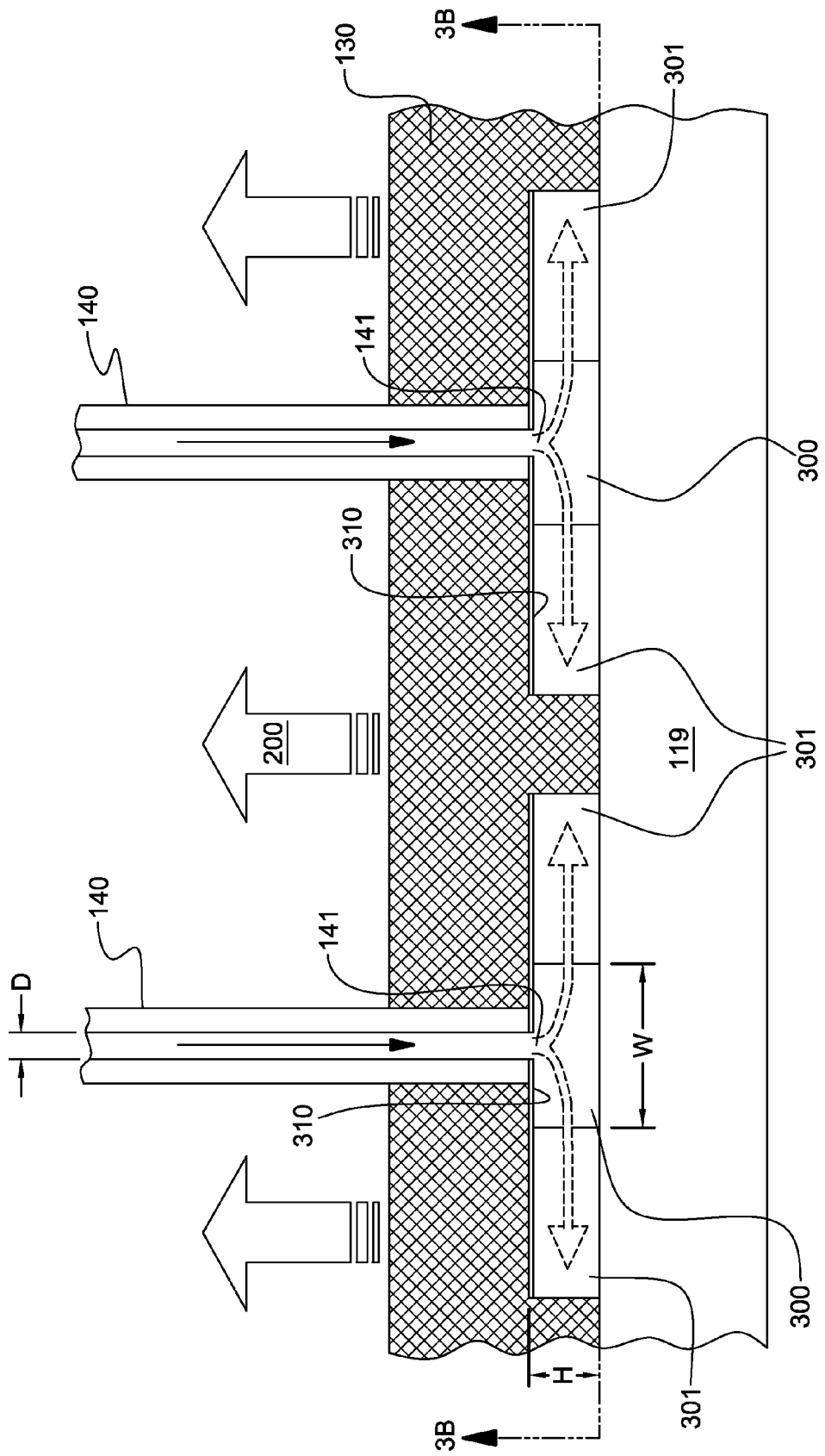
FIG. 3A is a cross-sectional elevational depiction of an alternate embodiment of the cooling apparatus depicted in FIGS. 1 & 2, and taken along lines 3A-3A in FIG. 3B, in accordance with an aspect of the present invention.
Figure 3B:
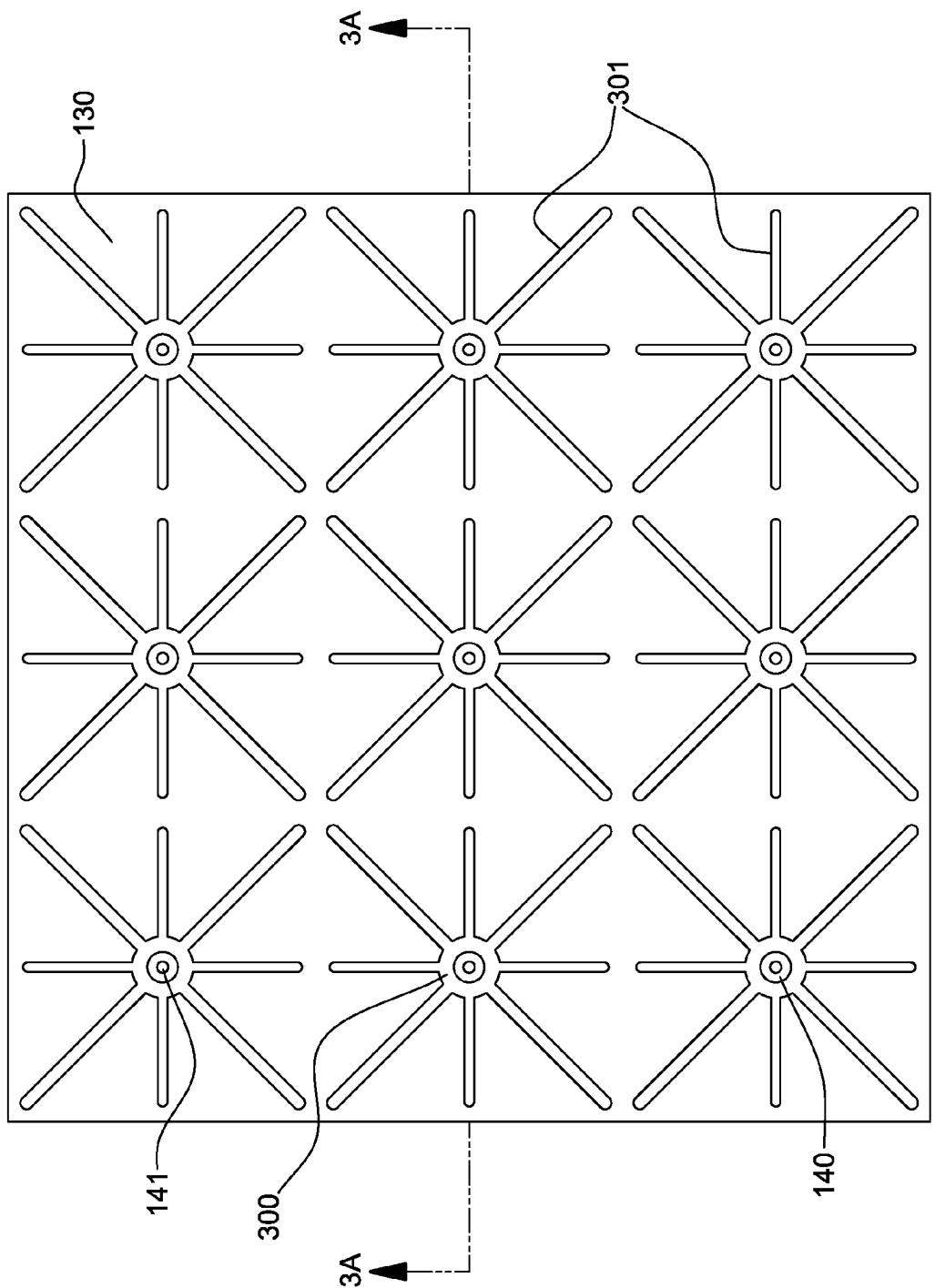
FIG. 3B is a cross-sectional plan view of the cooling apparatus embodiment of FIG. 3A, taken along line 3B-3B thereof, in accordance with an aspect of the present invention.

FIGS. 3A & 3B depict a variation on the structure of FIG. 2, wherein (as shown in FIG. 3A) an enlarged cavity portion 300 is provided within the thermally conductive porous material 130 coupled to thermally conductive base 119. In this embodiment, one or more jet nozzles 140, each having a jet orifice 141, extend into the thermally conductive material 130 to, for example, an edge of the respective, enlarged cavity portion 300. Each jet nozzle is spaced a height H from the surface to be cooled which is greater than two times the diameter D of the jet orifice 141, but less than five times (e.g., three times) the diameter D of the jet orifice (by way of example). The width W of the enlarged cavity portion 300 is, in one example, less than or equal to five times the diameter D of the jet orifice 141. As illustrated, the liquid coolant turns after impinging on the surface to be cooled and remains close to the surface to be cooled as it migrates into the thermally conductive porous material, which functions as a region of high-boiling heat transfer (or extended surface flow boiling). As coolant boils, coolant vapor 200 rises from the thermally conductive porous structure.

In the enlarged cavity portion 300 implementation of FIG. 3A, a barrier 310 is provided within the upper portion of the chamber adjacent to jet orifices 141 and extending outward from the jet nozzles. In one embodiment, this barrier 310 is a solid barrier, such as a metal or plastic plate, a flange extending outward from the jet nozzle, or an epoxy or other material disposed within the metal foam positioned to block fluid from bypassing the thermally conductive porous material 130 due to the pressure drop the wall jet experiences when entering the porous material. Note also, the cross-sectional plan shape of enlarged cavity portion 300 may vary for different applications. Additionally, one or more channels may extend outward from the enlarged cavity portion 300 to better distribute liquid coolant into the thermally conductive porous material after impinging on the surface to be cooled. In this regard, reference the star-shaped pattern of channels 301 in fluid communication with and extending from enlarged cavity portions 300 illustrated in FIG. 3B. As shown in FIG. 3A, in one embodiment, barrier 310 extends into the channels 301 to further facilitate distribution of coolant into thermally conductive porous material 130. As a further enhancement, one or more sub-channels (not shown) could be provided in thermally conductive porous material 130 extending from channels 301 to assist with distribution of the coolant into the porous material.

Figure 4:
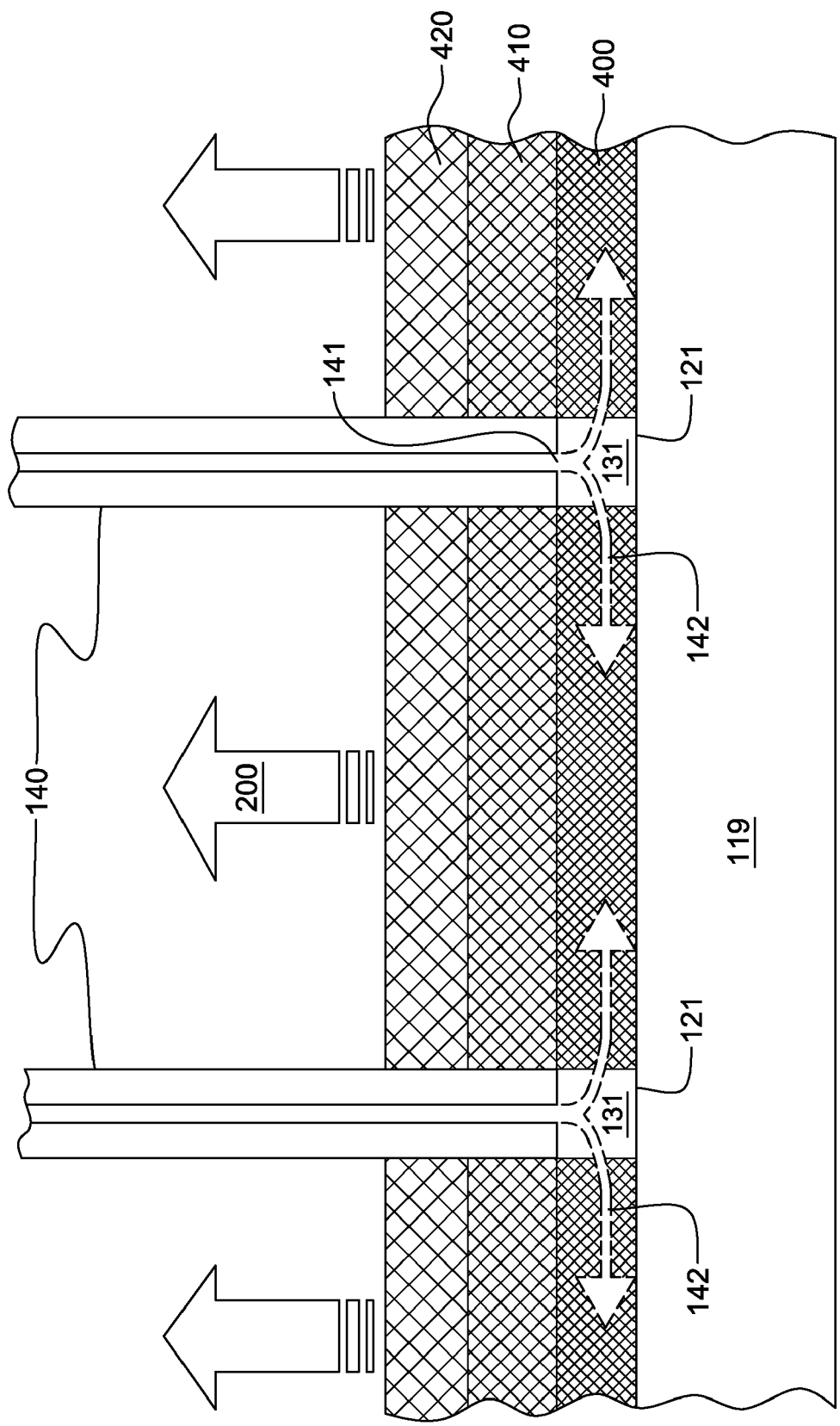
FIG. 4 is a cross-sectional elevational depiction of a further embodiment of the cooling apparatus depicted in FIGS. 1 & 2, in accordance with an aspect of the present invention.

FIG. 4 depicts another embodiment of the cooling apparatus structures depicted in FIGS. 2 & 3, wherein a thermally conductive porous material of varying porosity orthogonal to the surface to be cooled is illustrated coupled to a thermally conductive base 119 with a surface to be cooled 121. One or more jet nozzles 140 extend into the thermally conductive porous material, each having a jet orifice 141 for directing liquid coolant towards the surface to be cooled 121. Cavities 131 are provided within the porous material to facilitate positioning of the nozzles within the porous material, and subsequently, impinging of liquid coolant onto the surface to be cooled. After impinging on the surface to be cooled, liquid coolant 142 turns 90 degrees, and flows into the thermally conductive porous material, where it undergoes boiling and rises as vapor coolant 200 from the thermally conductive porous material.

In FIG. 4, multiple porous material layers 400, 410, 420 of thermally conductive porous material with different porosity (and density) are illustrated. These three porous material layers 400, 410, 420 are illustrated (by way of example only) with decreasing density and increasing porosity in a direction orthogonally away from the surface to be cooled. The advantage to this varying porosity structure arises from the fact that the refrigerant (or other coolant) travels upward through the porous material with an increasing percentage of evaporated refrigerant. Since coolant vapor has a much lower density than liquid coolant, the coolant vapor travels at increased velocities, which would add to pressure drop. Thus, a structure where density of the porous material decreases (and porosity increases) in a direction orthogonally away from the surface to be cooled advantageously mitigates the pressure drop by facilitating flow of vapor into the coolant return manifold.

Figure 5:
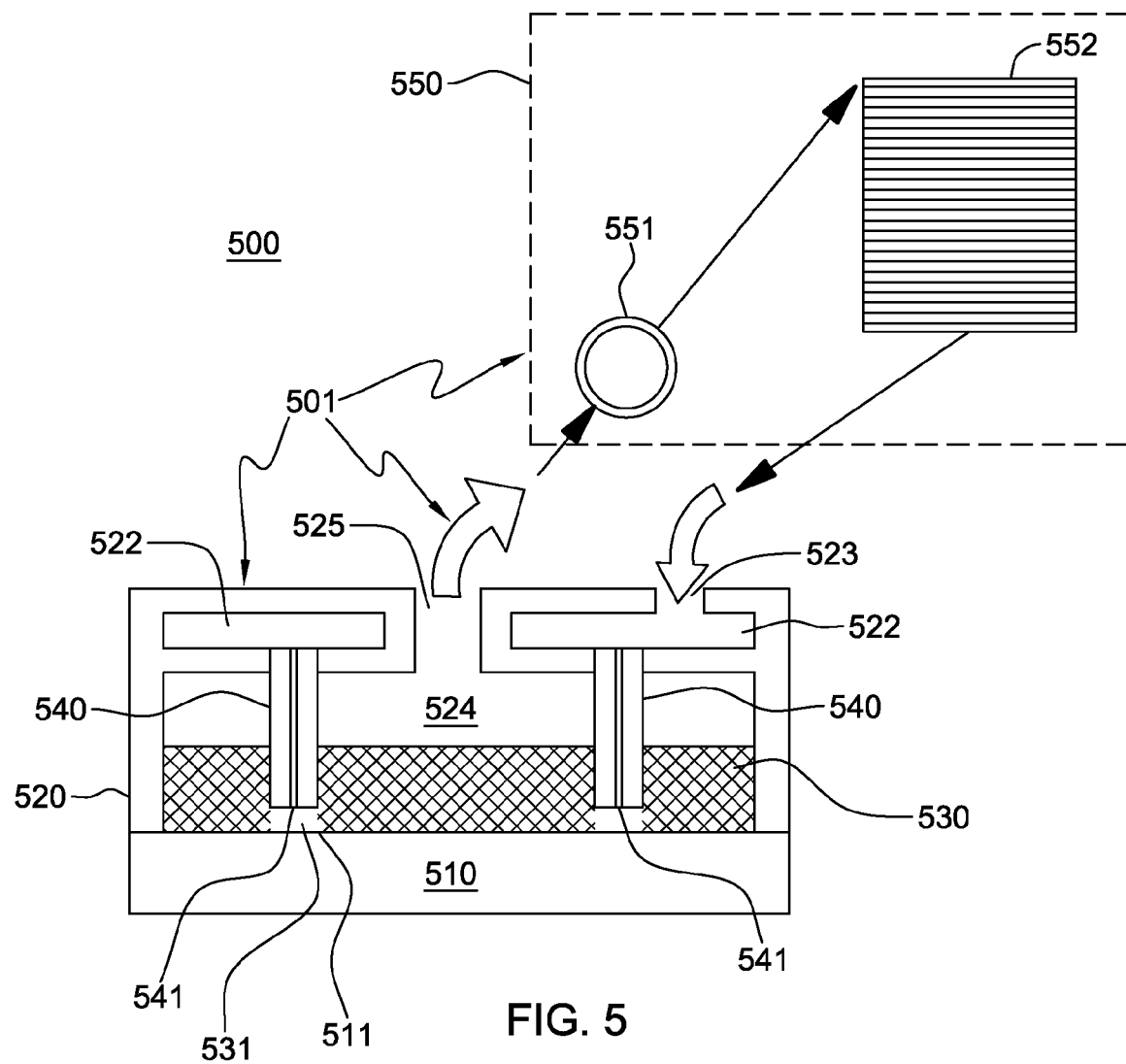
FIG. 5 depicts another embodiment of a cooled electronic device comprising a cooling apparatus which includes a vapor-compression heat exchange system, in accordance with an aspect of the present invention.

FIG. 5 depicts an alternate embodiment of a cooled electronic device 500, in accordance with an aspect of the present invention. As illustrated, cooled electronic device 500 includes a heat-generating electronic device 510 and a cooling apparatus 501. A housing 520 of cooling apparatus 501 is mounted to a main surface of the heat-generating electronic device 510, that is, to the surface 511 to be cooled. Housing 520 includes a coolant supply manifold 522 and coolant return manifold 524, which are in fluid communication with a vapor-compression unit 550 via appropriate tubing connecting coolant inlet 523 and coolant outlet 525 to the vapor-compression unit 550. The liquid coolant supply further includes one or more jet nozzles 540 in fluid communication with the coolant supply manifold 522, each extending into a respective cavity 531 in thermally conductive porous material 530. Each jet nozzle includes a jet orifice 541 which directs liquid coolant onto the surface 511 to be cooled. As illustrated, jet nozzles 540 extend at least partially into the thermally conductive porous material, for example, within appropriately sized cavities 531 in the porous material sized to accept the jet nozzles. The vapor-compression unit 550 includes a compressor 551 and a condenser 552, which may be an air or water-cooled condenser. Operation of the refrigeration loop is similar to that described above in connection with the embodiment of FIG. 1.

Advantageously, by mounting housing 520 directly to the surface 511 to be cooled of the electronic device 510, enhanced heat transfer is obtained. If a liquid coolant other than dielectric coolant is employed to cool surface 511 to be cooled, then a passivation or sealing layer may be interposed between the heat-generating electronic device and the thermally conductive porous material. In this regard, reference commonly assigned U.S. Pat. No. 6,366,462 B1.

Figure 6:
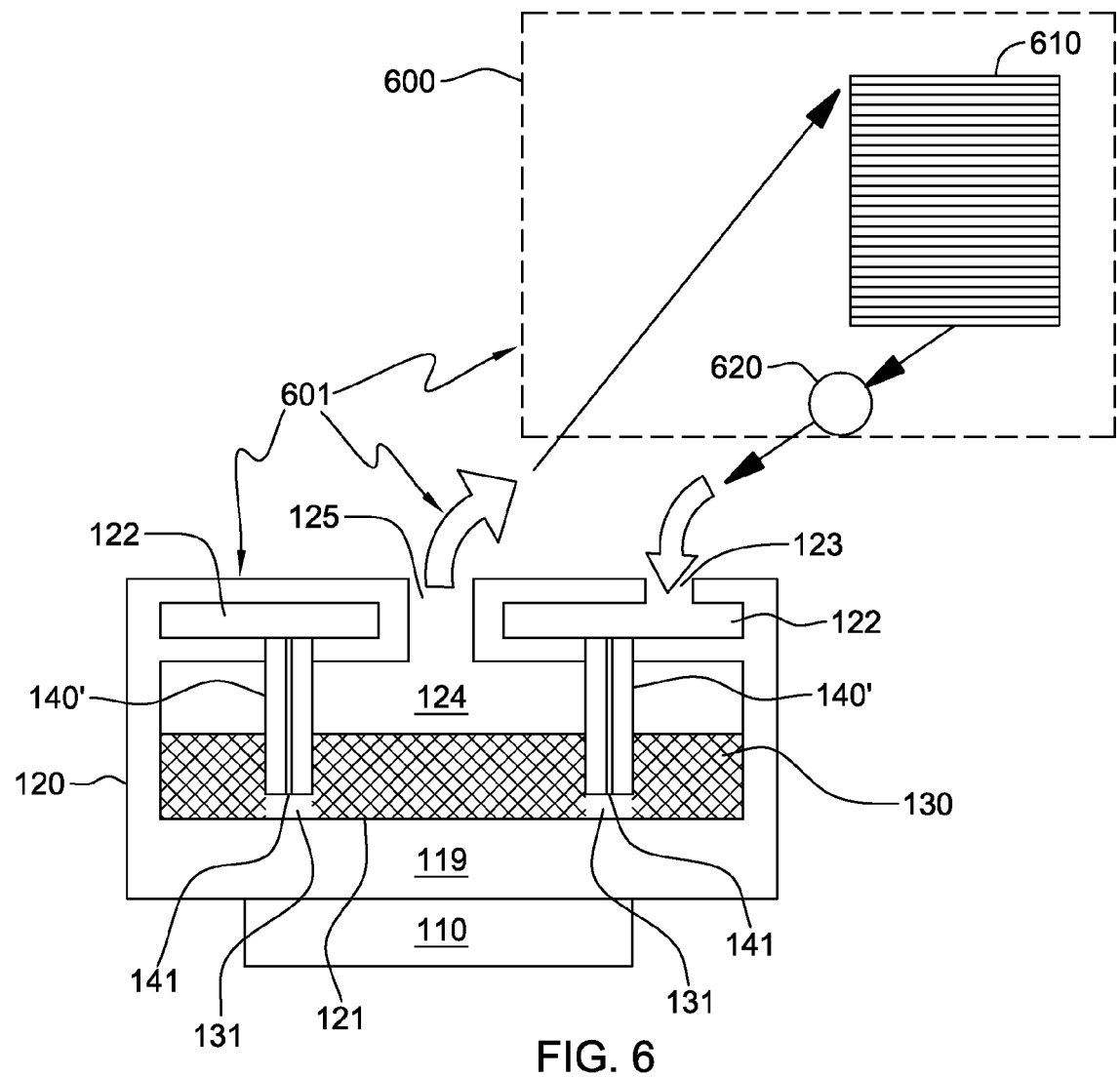
FIG. 6 depicts a further embodiment of a cooled electronic device comprising a cooling apparatus which includes a pumped two-phase coolant system, in accordance with an aspect of the present invention.

As a further variation, reference FIG. 6, wherein the cooling apparatus of FIG. 1, and in particular, the vapor-compression unit thereof, is replaced by a cooling apparatus 601 comprising a condensing unit 600 including a condenser 610 and a pump 620 coupled in fluid communication as shown. The embodiment illustrated in FIG. 6 is also applicable to the direct attach embodiment of FIG. 5, that is, the condensing unit 600 could be employed in place of the vapor-compression unit 550 in the embodiment of FIG. 5. In either case, the coolant is a two-phase coolant, but jet nozzles 140' would not be configured and sized to function as an expansion valve. In operation, the two-phase coolant, such as a dielectric coolant, passes through the liquid coolant supply comprising the jet impingement structure. As shown, the jet impingement structure includes the coolant supply manifold 122, coolant return manifold 124 and jet nozzles 140'. Coolant is returned from the condensing unit 600 via appropriate tubing coupling in fluid communication pump 620 and coolant inlet 123 of coolant supply manifold 122. From the coolant supply manifold, coolant is forced through jet orifices 141 and cavities 131 to impinge on the surface to be cooled 121 of thermally conductive base 119. As illustrated, thermally conductive base 119 is coupled to the heat-generating electronic device 110 to be cooled. The plurality of jet nozzles 140' reside within respective cavities 131 formed within the thermally conductive porous material 130 disposed within housing 120. Vaporized coolant is returned via the coolant return manifold 124, coolant outlet 125 and appropriate tubing to the condensing unit 600, for condensing of the vaporized coolant, and repetition of the cycle.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus comprising: a housing comprising a supply manifold and a return manifold, wherein the return manifold is in fluid communication with an outlet that extends through the supply manifold; a thermally conductive porous material coupled to a surface to be cooled, the thermally conductive porous material comprising at least one cavity exposing a portion of the surface to be cooled; and a liquid coolant supply comprising a jet impingement structure, the jet impingement structure comprising at least one jet nozzle for directing liquid coolant towards the surface to be cooled, wherein the at least one jet nozzle extends into the at least one cavity in the thermally conductive porous material coupled to the surface to be cooled and facilitates jet impingement of the liquid coolant onto the surface to be cooled.

2. The cooling apparatus of claim 1, wherein the thermally conductive porous material is a metal foam material bonded to the surface to be cooled.

3. The cooling apparatus of claim 1, wherein the thermally conductive porous material has a uniform porosity orthogonal to the surface to be cooled.

4. The cooling apparatus of claim 1, wherein the thermally conductive porous material has a varying porosity in a direction orthogonal to the surface to be cooled.

5. The cooling apparatus of claim 4, wherein porosity of the thermally conductive porous material increases in orthogonal direction away from the surface to be cooled.

6. The cooling apparatus of claim 1, wherein each cavity of the at least one cavity is sized to receive a respective jet nozzle of the at least one jet nozzle, and each jet nozzle of the at least one jet nozzle is spaced from the surface to be cooled within a respective cavity of the at least one cavity.

7. The cooling apparatus of claim 6, wherein each jet nozzle of the at least one jet nozzle comprises a jet orifice spaced a height H from the surface to be cooled, wherein height $H \leq 5$ times a diameter D of the jet orifice.

8. The cooling apparatus of claim 6, wherein each jet nozzle of the at least one jet nozzle comprises a jet orifice for directing coolant onto the surface to be cooled, each cavity of the at least one cavity in the thermally conductive porous material comprising a cavity portion disposed between a respective jet nozzle of the at least one jet nozzle and the surface to be cooled, wherein the cavity portion has a width W greater than a width of the respective jet nozzle, wherein width $W \leq 5$ times a diameter D of the respective jet nozzle's jet orifice, and wherein the cooling apparatus further comprises at least one barrier disposed adjacent to the respective jet nozzle, the at least one barrier blocking coolant flow directly from the cavity portion to along an exterior surface of the at least one jet nozzle.

9. The cooling apparatus of claim 1, wherein the liquid coolant is a refrigerant, and each jet nozzle of the at least one jet nozzle of the jet impingement structure is configured as an expansion valve for the refrigerant.

10. A cooled electronic device comprising: at least one heat-generating electronic device coupled to or comprising a surface to be cooled; and a cooling apparatus for cooling the surface to be cooled, and thereby cooling the at least one heat-generating electronic device, the cooling apparatus comprising: a housing comprising a supply manifold and a return manifold, wherein the return manifold is in fluid communication with an outlet that extends through the supply manifold; a thermally conductive porous material coupled to the surface to be cooled, the thermally conductive porous material comprising at least one cavity exposing a portion of the surface to be cooled; and a liquid coolant supply comprising a jet impingement structure, the jet impingement structure comprising at least one jet nozzle for directing liquid coolant towards the surface to be cooled, the at least one jet nozzle extending into the at least one cavity in the thermally conductive porous material coupled to the surface to be cooled and facilitates jet impingement of the liquid coolant onto the surface to be cooled, wherein the thermally conductive porous material coupled to the surface to be cooled facilitates boiling of liquid coolant passing therethrough.

11. The cooled electronic device of claim 10, wherein the liquid coolant supply further comprises a vapor-compression heat exchange system, and wherein the surface to be cooled and the thermally conductive porous material are an evaporator for the vapor-compression heat exchange system, and the at least one jet nozzle of the jet impingement structure is configured as at least one expansion valve for the vapor-compression heat exchange system, and wherein the vapor-compression heat exchange system further comprises a vapor-compression unit comprising a compressor and a condenser, the vapor-compression unit being in fluid communication with the jet impingement structure, the at least one jet nozzle, the surface to be cooled and the thermally conductive porous material for exhausting heat from coolant circulating therethrough.

12. The cooled electronic device of claim 10, wherein the liquid coolant supply further comprises a pumped two-phase coolant system, and wherein the surface to be cooled and the thermally conductive porous material are an evaporator for the pumped two-phase coolant system, and the pumped two-phase coolant system further comprises a condenser for exhausting heat from the two-phase coolant circulating therethrough.

13. The cooled electronic device of claim 10, wherein the thermally conductive material is a metal foam material bonded to the surface to be cooled, and wherein the thermally conductive porous material has a uniform porosity orthogonal to the surface to be cooled.

14. The cooled electronic device of claim 10, wherein the thermally conductive porous material is a metal foam material bonded to the surface to be cooled, and wherein the thermally conductive porous material has a varying porosity in a direction orthogonal to the surface to be cooled.

15. The cooled electronic device of claim 14, wherein porosity of the thermally conductive porous material increases in an orthogonal direction away from the surface to be cooled.

16. The cooled electronic device of claim 10, wherein the jet impingement structure comprises a plurality of jet nozzles for directing liquid coolant onto the surface to be cooled, and wherein the thermally conductive porous material includes a plurality of cavities, each cavity of the plurality of cavities being sized to receive a respective jet nozzle of the plurality of jet nozzles, and each jet nozzle of the plurality of jet nozzles being spaced from the surface to be cooled within a respective cavity of the plurality of cavities.

17. The cooled electronic device of claim 16, wherein each jet nozzle of the at least one jet nozzle comprises a jet orifice spaced a height H from the surface to be cooled, wherein height $H \leq 10$ times a diameter D of the jet orifice, and each cavity of the plurality of cavities comprises a width W, wherein width W≦5 times diameter D of the respective jet nozzle's jet orifice.

18. The cooled electronic device of claim 16, wherein each cavity of the plurality of cavities in the thermally conductive porous material comprises a cavity portion with a width W disposed between the respective jet nozzle and the surface to be cooled, wherein width W is greater than a width of the respective jet nozzle.

19. A method of fabricating a cooling apparatus for cooling a heat-generating electronic device coupled to or comprising a surface to be cooled, the method comprising: providing a housing including a supply manifold and a return manifold, wherein the return manifold is in communication with an outlet that extends through the supply manifold; providing a thermally conductive porous material with at least one cavity extending therethrough; and bonding the thermally conductive porous material to the surface to be cooled, wherein a portion of the surface to be cooled is exposed by the at least one cavity extending through the thermally conductive porous material; and disposing, in spaced relation to the surface to be cooled, at least one jet nozzle of a jet impingement structure of a liquid coolant supply at least partially within the at least one cavity so as to facilitate jet impingement of the liquid coolant onto the surface to be cooled, wherein the thermally conductive porous material coupled to the surface to be cooled facilitates boiling of liquid coolant passing therethrough.

20. The method of claim 19, wherein the thermally conductive porous material is a metal foam material, and wherein the bonding comprises metallurgically bonding the metal foam material to the surface to be cooled.

* * * * *